(12) United States Patent
Kurita et al.

(10) Patent No.: US 10,280,510 B2
(45) Date of Patent: *May 7, 2019

(54) SUBSTRATE SUPPORT ASSEMBLY WITH NON-UNIFORM GAS FLOW CLEARANCE

(71) Applicant: Applied Materials, Inc., Santa Clara, CA (US)

(72) Inventors: Shinichi Kurita, San Jose, CA (US); Robin L. Tiner, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 75 days.

This patent is subject to a terminal disclaimer.

(21) Appl. No.: 15/082,015

(22) Filed: Mar. 28, 2016

(65) Prior Publication Data

US 2017/0275759 A1 Sep. 28, 2017

(51) Int. Cl.
*C23C 16/455* (2006.01)
*C23C 16/458* (2006.01)
(Continued)

(52) U.S. Cl.
CPC .... *C23C 16/45591* (2013.01); *C23C 16/4583* (2013.01); *C23C 16/4585* (2013.01); *C23C 16/4587* (2013.01); *C23C 16/45508* (2013.01); *C23C 16/50* (2013.01); *H01J 37/32357* (2013.01); *H01J 37/32715* (2013.01); *H01L 21/68735* (2013.01); *H01L 21/68785* (2013.01); *H01J 2237/327* (2013.01);
(Continued)

(58) Field of Classification Search
None
See application file for complete search history.

(56) References Cited

U.S. PATENT DOCUMENTS 8,709,162 B2 * 4/2014 Leung ................ C23C 16/4586
118/724
2005/0016468 A1 1/2005 Ruhl et al.
(Continued)

FOREIGN PATENT DOCUMENTS

KR 20120077546 A 7/2012
KR 1442776 9/2014
KR 101522633 B1 5/2015

OTHER PUBLICATIONS

Machine Generated English Translation of KR1020120077546. Published Jul. 10, 2012.*
(Continued)

*Primary Examiner* — Sylvia MacArthur
(74) *Attorney, Agent, or Firm* — Patterson + Sheridan LLP (57) ABSTRACT

The embodiments described herein generally relate to a substrate support assembly for use in a plasma processing chamber to provide non-uniform gas flow flowing between the substrate support assembly and sidewalls of the plasma processing chamber. In one embodiment, a substrate support assembly includes a substrate support assembly including a substrate support body defining at least a first side of the substrate support body, and a corner region and a center region formed in the first side of the substrate support body, wherein the corner region has a corner width that is smaller than a center width of the center region, the widths defined between a center axis and the first side of the substrate support body.

8 Claims, 9 Drawing Sheets

(51) Int. Cl.
*C23C 16/50* (2006.01)
*H01J 37/32* (2006.01)
*H01L 21/687* (2006.01)

(52) U.S. Cl.
CPC ... *H01J 2237/334* (2013.01); *H01J 2237/335* (2013.01); *H01J 2237/3321* (2013.01); *H01J 2237/3323* (2013.01)

(56) References Cited

U.S. PATENT DOCUMENTS

| | | | | |
|---|---|---|---|---|
| 2006/0005771 | A1* | 1/2006 | White | C23C 16/4583 |
| | | | | 118/728 |
| 2006/0011137 | A1* | 1/2006 | Keller | C23C 16/042 |
| | | | | 118/720 |
| 2009/0107955 | A1* | 4/2009 | Tiner | C23C 16/4404 |
| | | | | 216/67 |
| 2011/0146577 | A1* | 6/2011 | Anwar | C23C 16/45565 |
| | | | | 118/723 R |
| 2014/0109940 | A1* | 4/2014 | Ohashi | H01J 7/32449 |
| | | | | 134/37 |
| 2015/0211120 | A1* | 7/2015 | Zhao | C23C 16/45591 |
| | | | | 239/461 |
| 2015/0211121 | A1 | 7/2015 | Zhao et al. | |
| 2017/0081757 | A1* | 3/2017 | Kurita | C23C 16/042 |

OTHER PUBLICATIONS

Machine Generated English Translation of KR1020100039793. Published Apr. 16, 2010.*

* cited by examiner

SUBSTRATE SUPPORT ASSEMBLY WITH NON-UNIFORM GAS FLOW CLEARANCE

BACKGROUND

Field of the Invention

Embodiments disclosed herein generally relate to an apparatus for fabricating films on substrates in a processing chamber, more particularly, for a substrate support assembly used in a processing chamber to provide non-uniform gas flow for plasma processing applications.

Description of the Related Art

Liquid crystal displays or flat panels are commonly used for active matrix displays, such as computer, television, and other monitors. Plasma enhanced chemical vapor deposition (PECVD) is used to deposit thin films on a substrate, such as a semiconductor wafer or a transparent substrate for a flat panel display. PECVD is generally accomplished by introducing a precursor gas or gas mixture into a vacuum chamber containing a substrate. The precursor gas or gas mixture is typically directed downwardly through a distribution plate situated near the top of the processing chamber. The precursor gas or gas mixture in the processing chamber is energized (e.g., excited) into a plasma by applying a power, such as a radio frequency (RF) power, to an electrode in the processing chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer. The layer may be a part of a larger structure, such as, for example, a thin film transistor (TFT) or an active matrix organic light emitting diodes (AMOLED) used in a display device.

Flat panels processed by PECVD techniques are typically large. For example, the flat panel may exceed 4 square meters. During a deposition processing, a plasma is generated to form active ions so as to deposit a material layer on a substrate. The plasma may be easily ignited in processing chambers that utilized capacitively coupled power, inductively coupled power, or microwave power to energize the gases forming the plasma. However, the plasma generated in the processing chamber as well as gas flow distribution may often not be uniformly distributed all across an entire surface of the substrate. For example, the plasma or precursor gas flow may not always extend to an edge of the substrate, resulting in different edge to center processing rates. Non-uniform plasma or gas flow distribution at different locations across the substrate surface may result in asymmetrical or non-uniform processing profiles of the target-processing material disposed on the substrate, which may affect the deposition uniformity and defect rates. As such, non-uniform plasma or gas flow distribution across the substrate surface may eventually result in defects, such as feature deformation, non-uniform or irregular feature profile of the resultant material layer formed on the substrate. Furthermore, non-uniform plasma or gas flow distribution across the substrate surface may also affect the cleaning uniformity and efficiency, and may impact removal film deposits, cause flaking or over-clean and erode chamber component during cleaning processes.

Therefore, there is a need for an improved apparatus for controllable plasma or gas flow distribution control across a substrate surface during a plasma process.

SUMMARY

The embodiments described herein generally relate to a substrate support assembly for use in a plasma processing chamber that provides controllable non-uniform gas flow between the substrate support assembly and sidewalls of the plasma processing chamber. In one embodiment, a substrate support assembly includes a substrate support assembly including a substrate support body defining at least a first side of the substrate support body, and a corner region and a center region formed in the first side of the substrate support body, wherein the corner region has a corner width that is smaller than a center width of the center region, the widths defined between a center axis and the first side of the substrate support body.

In another embodiment, a processing chamber includes a chamber body comprising a top wall, a sidewall and a bottom wall defining a processing region in the chamber body, a substrate support assembly positioned in the processing region, the substrate support assembly having an outer profile selected to preferentially direct more flow passing between the substrate support assembly and sidewall to a corner region relative to a center region or to the center region relative to the corner region, and a pumping port disposed through the bottom wall of the chamber body under the substrate support assembly.

In yet another embodiment, a method of controlling a non-uniform gas flow in a processing chamber includes directing a deposition gas flow through a corner gap and a center gap defined between a substrate support assembly and a sidewall of a processing chamber into a processing region defined in the processing chamber, wherein the gas flow has a first flow rate flowing through the corner gap that is greater than a second flow rate through the center gap.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a substrate support assembly with various outer perimeter geometries configured to alter the gas flow path along edge regions and across an upper surface of the substrates when positioned in a processing chamber. The outer perimeter geometry of the substrate support assembly may be selected to control the gas flow path, gas flow rate, gas flow velocity and process gas velocity passing between the substrate support assembly and the chamber wall so that the deposition profile, etching profile or cleaning profile resulting from deposition, etch, or cleaning processes performed in the processing chamber may be efficiently controlled.

Embodiments herein are illustratively described below in reference to a PECVD system configured to process large area substrates, such as a PECVD system, available from AKT America, Inc., a division of Applied Materials, Inc., located in Santa Clara, Calif. However, it should be understood that the disclosed substrate support assembly has utility in other system configurations such as etch systems, other chemical vapor deposition systems, and other plasma processing systems. It should further be understood that embodiments disclosed herein may be practiced using process chambers provided by other manufacturers.

Figure 1:
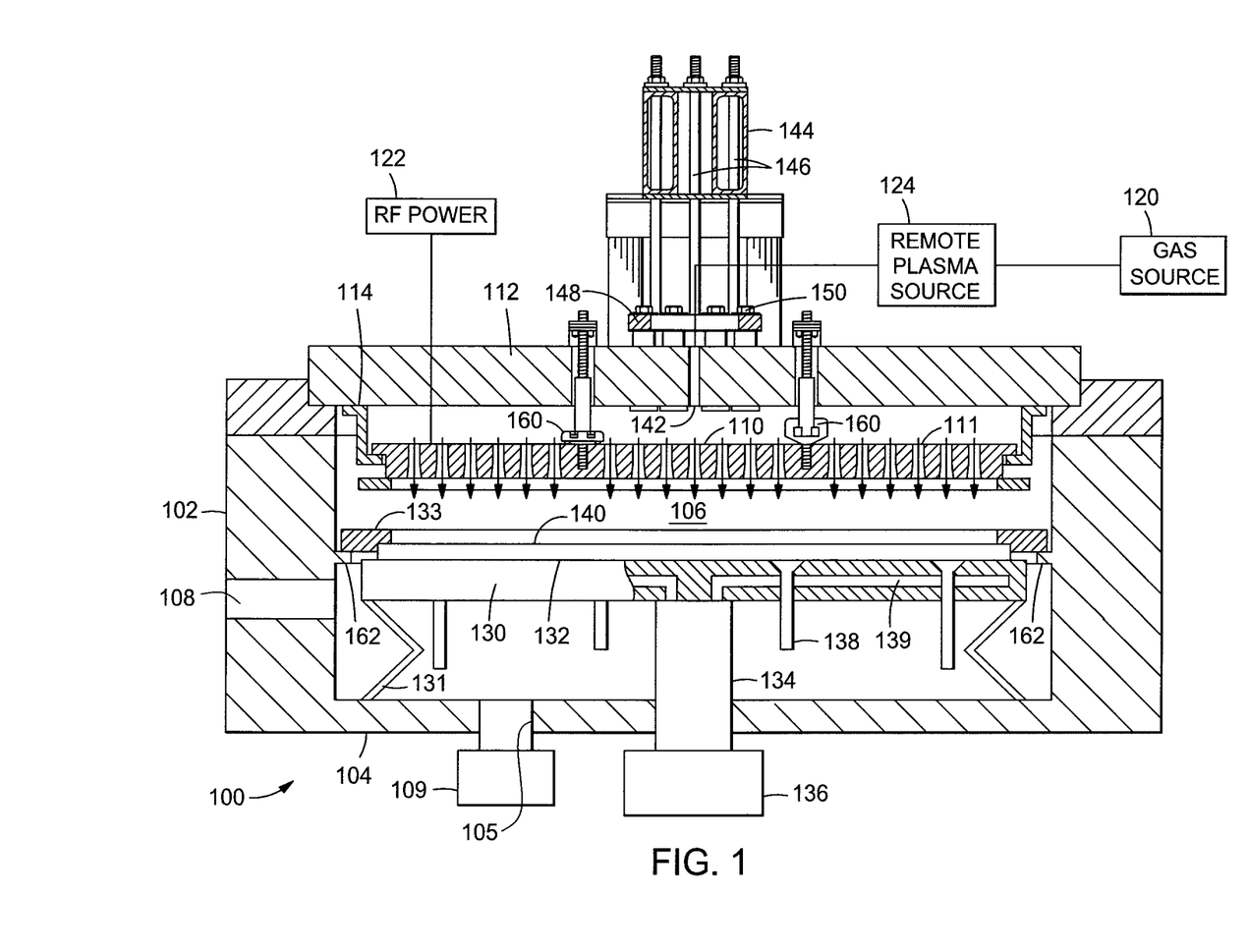
FIG. 1 depicts a cross-sectional view of a processing chamber according to one embodiment.

FIG. 1 is a cross sectional view of PECVD apparatus according to one embodiment. The apparatus includes a vacuum processing chamber 100 in which one or more films may be deposited onto a substrate 140. The vacuum processing chamber 100 may be used to process one or more substrates, for example, semiconductor substrates, flat panel display substrates, and solar panel substrates, among others.

The processing chamber 100 generally includes sidewalls 102, a bottom 104 and a showerhead 110 that define a processing volume 106. A substrate support (or susceptor) assembly 130 is disposed in the processing volume 106. The substrate support assembly 130 includes a substrate receiving surface 132 for supporting the substrate 140. The process volume 106 is accessed through an opening 108 formed through the sidewalls 102 such that the substrate 140 may be transferred in and out of the chamber 100 when the substrate support assembly 130 is in the lowered position. One or more stems 134 may be coupled to a lift system 136 to raise and lower the substrate support assembly 130. As shown in FIG. 1, the substrate is in a lowered position where the substrate 140 can be transferring into and out of the chamber 100. The substrate 140 can be elevated to a processing position, not shown, for processing. The spacing between the top surface of the substrate 140 disposed on the substrate receiving surface 132 and the showerhead 110 may be between about 400 mil and about 1,200 mil when the substrate support assembly 130 is raised to the processing position. In one embodiment, the spacing may be between about 400 mil and about 800 mil.

Lift pins 138 are moveably disposed through the substrate support assembly 130 to space the substrate 140 from the substrate receiving surface 132 to facilitate robotic transfer of the substrate. The substrate support assembly 130 may also include heating and/or cooling elements 139 to maintain the substrate support assembly 130 at a desired temperature. The substrate support assembly 130 may also include RF return straps 131 to provide a RF return path at the periphery of the substrate support assembly 130.

The showerhead 110 may be coupled to a backing plate 112 at its periphery by a suspension 114. The showerhead 110 may also be coupled to the backing plate 112 by one or more coupling supports 160 to help prevent sag and/or control the straightness/curvature of the showerhead 110.

A gas source 120 may be coupled to the backing plate 112 to provide processing gas through a gas outlet 142 in the backing plate 112 and through gas passages 111 in the showerhead 110 to the substrate 140 disposed on the substrate receiving surface 132. A vacuum pump 109 may be coupled to the chamber 100 to control the pressure within the process volume 106. An RF power source 122 is coupled to the backing plate 112 and/or to the showerhead 110 to provide RF power to the showerhead 110. The RF power creates an electric field between the showerhead 110 and the substrate support assembly 130 so that a plasma may be generated from the gases between the showerhead 110 and the substrate support assembly 130. Various frequencies may be used, such as a frequency between about 0.3 MHz and about 200 MHz. In one embodiment, the RF power source is provided at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 so that a remote plasma is generated and provided into the processing volume 106 to clean chamber components. The cleaning gas may be further excited while in the processing volume 106 by power applied to the showerhead 110 from the RF power source 122. Suitable cleaning gases include but are not limited to $NF_3$, $F_2$, and $SF_6$.

A frame 133 may be placed adjacent to the periphery region of the substrate 140, either in contact with or spaced from the substrate 140. In some embodiments, the frame 133 may be configured to be disposed under the substrate 140. In other embodiments, the frame 133 may be configured to be disposed over the substrate 140. The frame 133 may be a shadow frame, a non-contact frame (e.g., the frame is not in contact with a substrate when positioned on the substrate support assembly 130), a floating frame, a removable frame, a confinement ring, a flow control structure, or other suitable structure positionable adjacent the periphery of the substrate 140.

In the embodiment depicted in FIG. 1, the frame 133 may rest on a frame support 162 when the substrate support assembly 130 is lowered to provide clearance for the substrate 140 being placed on or removed from the substrate support assembly 130. In one embodiment, the frame support 162 may comprise the same material as the chamber sidewalls 102. In another embodiment, the frame support 162 may comprise a conductive material, dielectric material, stainless steel or aluminum. The frame 133 may reduce deposition at the edge of the substrate 140 and on areas of the substrate support assembly 130 that are not covered by the substrate 140. When the substrate support assembly 130 is elevated to the processing position, the frame 133 may engage the substrate 140 and/or substrate support assembly 130, and be lifted off of the frame support 162.

During the cleaning process, the frame 133 may rest on the frame support 162. The substrate receiving surface 132 may also be raised to a level that touches the frame 133 without lifting the frame 133 off from the frame support 162 during cleaning.

The substrate support assembly 130 has an outer profile defining a periphery of the substrate support assembly 130. The amount of open area between the substrate support assembly 130 and sidewalls of the processing chamber 100 controls the amount of gas passing by the substrate support assembly 130 and substrate 140 positioned thereon. Thus, by preferentially having more open area proximate one region of the substrate support assembly 130 relative to another region, the amount of gas flowing by one region of the substrate support assembly 130 and substrate 140 relative to another may be controlled. For example, the open area proximate a center region of the substrate support assembly 130 may be different than the open area proximate a corner region of the substrate support assembly 130, thus preferentially directing more flow through the area with more open area. Preferentially directing more flow to one region may be utilized to compensate for other conductance asymmetries to produce a more uniform flow across the substrate, or to cause more gas to flow over one region of the substrate relative to another. In one example, flow may be preferentially directed to a center region of the substrate support assembly 130 relative to a corner region. In another example, flow may be preferentially directed to a corner region of the substrate support assembly 130 relative to a center region. In another example, flow may be preferentially directed to one side of the substrate support assembly 130 relative to another side. The open area on a side of the substrate support assembly 130 may be selected by selecting the geometry of the profile of the substrate support assembly 130 to control the width across a gap between the profile of the substrate support assembly 130 and sidewall of the processing chamber 100, such as the curvature of the perimeter of the substrate support assembly 130, as further discussed below.

Figure 2A:
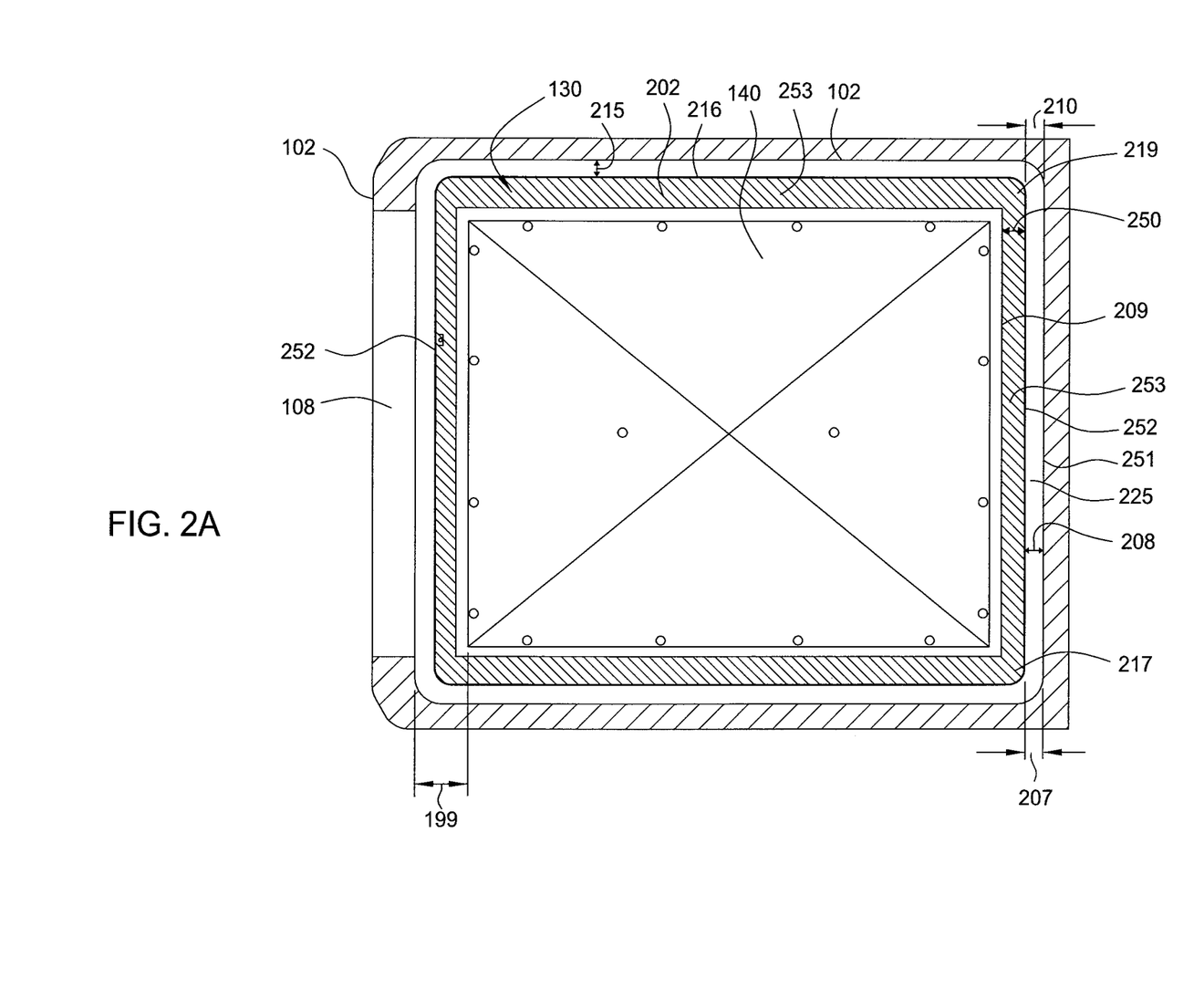
FIGS. 2A-2C depict top view of different examples of substrate support assemblies utilized in a processing chamber.

FIG. 2A depicts a top view of the substrate support assembly 130 that may be utilized in a processing chamber, such as the processing chamber 100 depicted in FIG. 1. It is noted that the frame 133 is not shown/presented in this embodiment. The substrate support assembly 130 includes a solid support body 202. The solid support body 202 is in a substantially square/rectangular form having the substrate 140 to be rest on during processing.

The substrate 140 has an edge 209 having a predetermined distance 250 away from a sidewall 252 of the substrate support assembly 130. In the embodiment depicted in FIG. 2A, a gap 225 is defined between the substrate support assembly 130 and an inner wall 251 of the sidewall 102 of the processing chamber 100. In contrast, in the examples depicted in FIGS. 2B and 2C, substrate support assemblies 222, 224 are positioned against and in contact with the inner wall 251 of the sidewall 102 of the processing chamber 100 substantially without a gap formed therebetween.

In the example depicted in FIG. 2A, the sidewall 252 of the substrate support assembly 130 has a substantially straight profile that is in a spaced-apart relationship with the an inner wall 251 of the sidewall 102 of the processing chamber 100, which defines the gap 225 between the four walls 216, 252 of the substrate support assembly 130 and the sidewall 102 of the processing chamber 100. The gap 225 between a center region 253 of the substrate support assembly 130 and the sidewall 102 of the processing chamber 100 may have a predetermined width 215, 208, that is in some embodiments, greater than about 40 mm. As the outer walls 252, 216 of the center region 253 of the substrate support assembly 130 are configured to be substantially straight, the widths 215, 208 between the four walls of the outer walls 252, 216 of the substrate support assembly 130 and the sidewalls 102 of the processing chamber 100 may be equal. For example, the widths 215, 208 between the outer wall 216 and/or the outer wall 252 and the sidewall 102 of the processing chamber 100 respectively may be substantially the same. Furthermore, as the outer walls 216, 252 of the substrate support assembly 130 are configured to be substantially straight, a first width 207 and a second width 210 defined from a first corner 217 of the substrate support assembly 130 to a second corner 219 along the sidewall 102 of the processing chamber 100 are substantially the same as the width 208, 215 defined in the center region 253 of the substrate support assembly 130.

It is noted that the terms or phrases "corner" or "corner region" as described herein represents the area bounded in part by interesting sides of the substrate support assembly and extending less than about one fourth of the length of each of the sides in a direction away from their intersection. The terms or phrases "center" or "center region" as described herein represents a portion of a side which includes a center point of the side and bounded by two adjacent corner regions (for example about one third to one half of the total length of a side of the substrate support assembly).

Figure 2B:
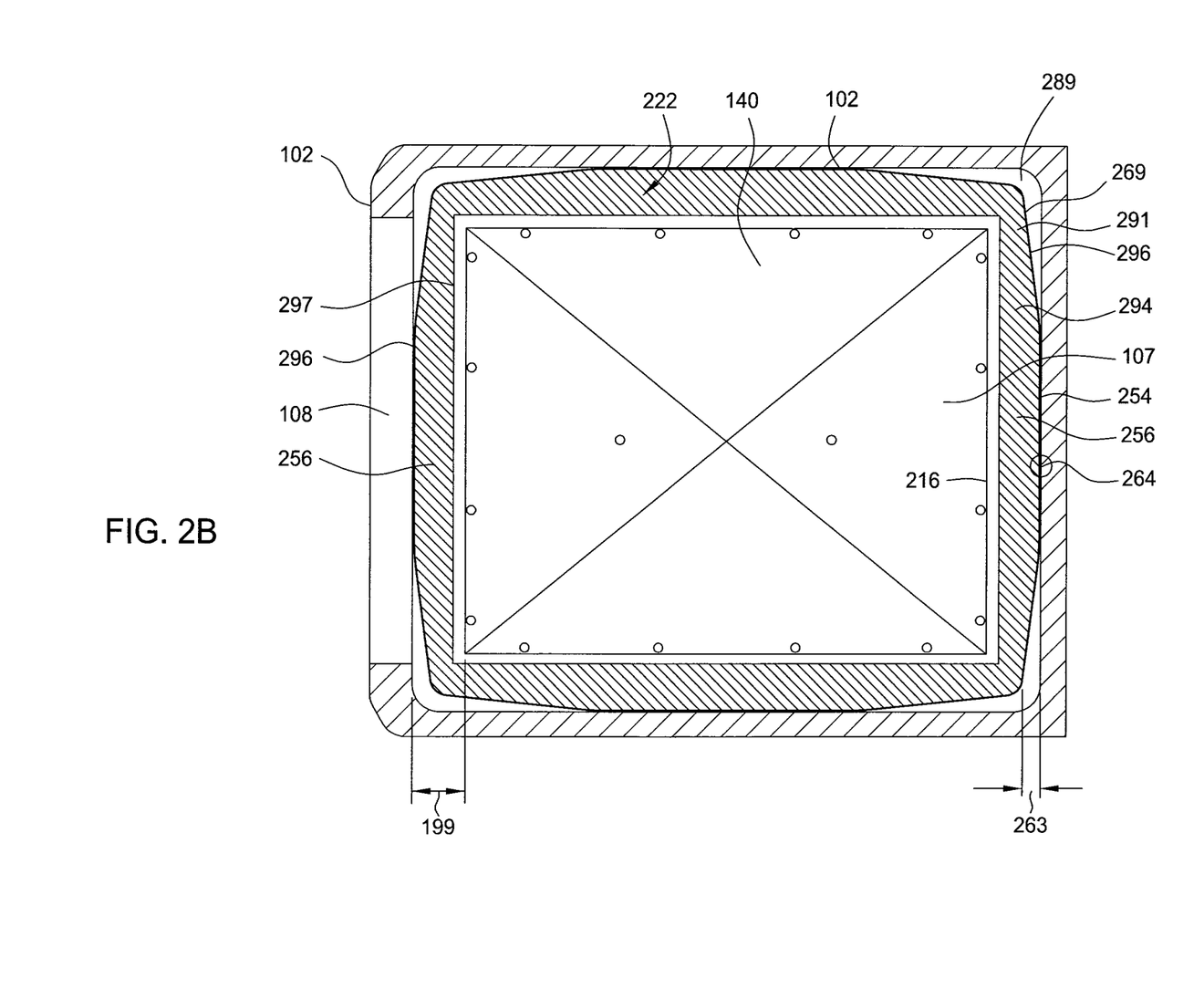

FIG. 2B depicts another example of a substrate support assembly 222 that may be utilized in a processing chamber, such as the processing chamber 100 depicted in FIG. 1. Similar to the substrate support assembly 130 depicted in FIG. 2A, the substrate support assembly 222 of FIG. 2B includes a solid substrate support body 294 sized to allow the substrate 140 to be positioned therein.

The substrate support assembly 222 further includes an outer wall 296 defining an outer perimeter of the solid substrate support body 294. In one example, the outer wall 296 of the solid substrate support body 294 may be non-linear. For example, the outer wall 296 may have a curvature (e.g., bow) defined by a center region 256 being in close proximity to (e.g., a width 264 less than 10 mm) the sidewall 102 of the processing chamber 100. The center region 256 may define a first surface 254 having a first curvature.

A corner region 291 of the outer wall 296 is positioned farther away from the sidewall 102 of the processing chamber 100 relative to the center region 256, thus forming a corner gap 289 between the corner region 291 and the sidewall 102 of the processing chamber 100. A second surface 269 having a second curvature may be formed at the corner region 291 of the outer wall 296 of the substrate support assembly 222. The curved second surface 269 is configured to have the greater curvature (i.e., radius) greater than the curvature of the first surface 254. In some examples, the first surface 254 in the center region 256 may be configured to have a minimal to zero curvature (e.g., be substantially linear across the center region 256) for ease of matching the substrate support assembly 222 with the sidewall 102 of the processing chamber 100 with a minimal gap formed therebetween.

It is believed that the further spacing of the corner region 291 of the substrate support assembly 222 relative to the center region 256 will preferentially direct more processing gases to the corners of the substrate relative to the edge of the substrate. The additional gas flow passing through the corner gap 289 defined between the substrate support assembly 222 and the sidewall 102 relate to the center gap (not shown in FIG. 2B) may alter the gas flow path flowing across a surface of the substrate 140. The geometry of the outer wall 296 may affect the width 264, 263 and dimensions of the corner gap 289 as well as the center gap formed between the sidewall 102 and the center and corner regions 256, 291 of the substrate support assembly 222, thus providing a controllable choked flow of the gases passing between the substrate support assembly 222 and the sidewall 102. It is believed that the difference in the flow of the gases flowing through the corner gap 289 relative to the center gap may create a flow gradient of process gases across the upper surface of the substrate 140, which may be beneficial for certain deposition processes. By utilizing a larger corner gap 289 formed at corner region 291 relative to the center gap from in the center region 256, the flow through the corner gap 289 may be increased. Thus, the geometry of the outer wall 296 may be selected to control the size/dimension of the corner gap 289 relative to center gap, thus enabling the corner gas flow to be controlled relative to the center gas flow. Non-uniform dimensions of the gaps formed in the center and corner regions 256, 291 of the substrate support assembly 222 with the sidewall 102 of the processing chamber 100 may efficiently alter the gas flow distribution across the substrate surface. As different conductance of the choked flow results in different amounts of processing gases to reach different areas of the substrate, the film profile, film properties and film thickness deposited on the surface of the substrate 140 may be controlled. The same flow control provided during deposition by the substrate support assembly 222 also allows the cleaning efficiency to be controlled across different areas of the processing chamber 100 during the cleaning process.

It has been discovered that by having a predetermined size/dimension ratio of the corner gap 289 relative to the center gap, film properties/cleaning uniformity can be adjusted. As further depicted in FIG. 2C, a center gap 287 may be defined between the sidewall 102 and a substrate support assembly 224 with a relatively linear surface 279 formed as an outer wall 285 in a center region 283 of the substrate support assembly 224. A relatively curved surface 282 may be formed at a corner region 281 of the outer wall 285 of the substrate support assembly 224. The center gap 287 may have a width 205 between about 10 mm and about 40 mm. As the geometry of the outer wall 285 has different curvatures at different regions (e.g., the center and the corner regions 283, 281), the center gap 287 and the corner gap 280 defined between the substrate support assembly 224 and the sidewall 102 will have different widths, thus allowing greater gas flow at the corner regions 283, 281. As a result, the higher corner gas flow alters the gas flow path/profile across the upper surface of the substrate 140, which changes the deposition/cleaning properties.

Figure 2C:
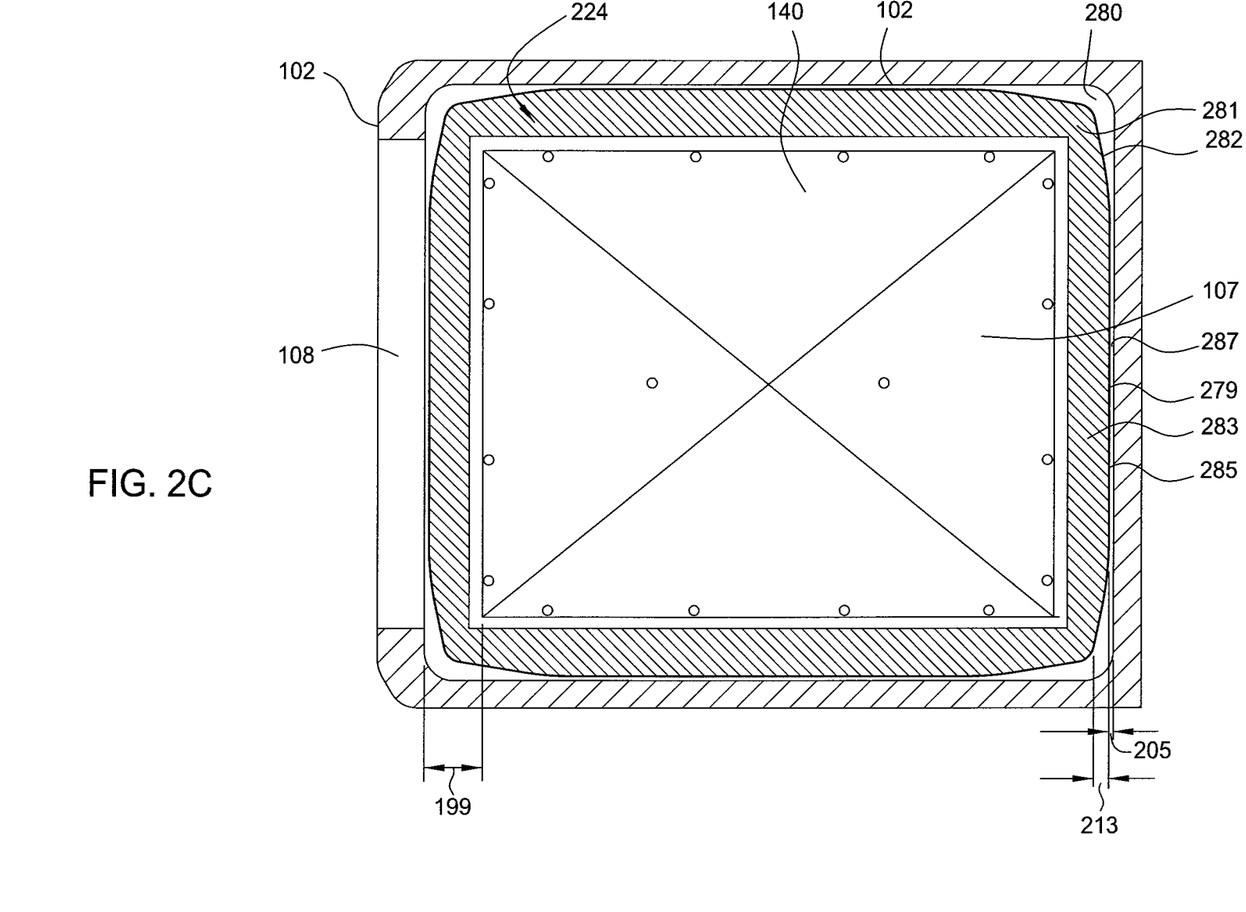
Figure 3A:
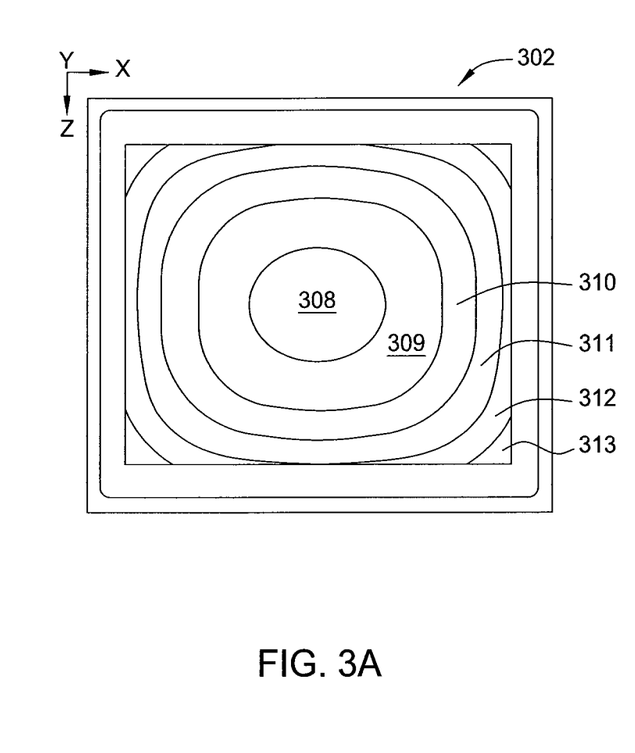
FIGS. 3A-3C depict pressure profile maps utilizing different examples of the substrate support assemblies of FIGS. 2A-2C.
Figure 3B:
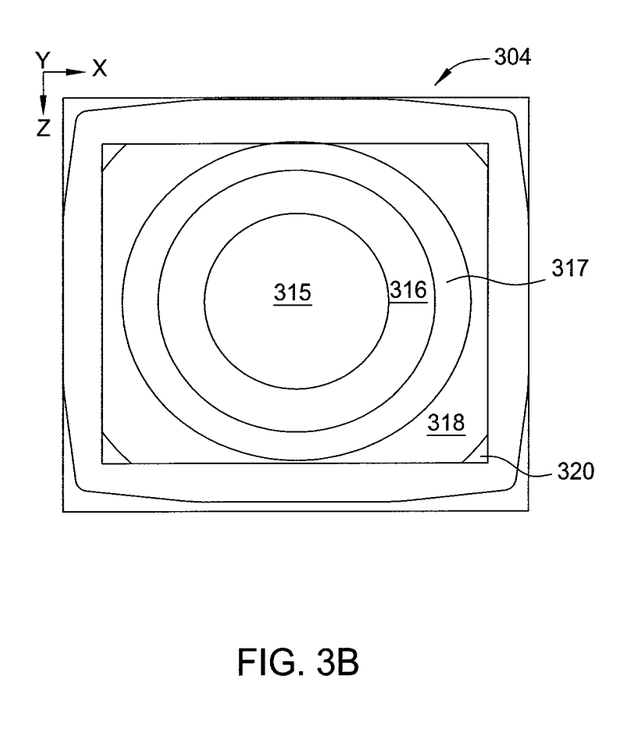
Figure 3C:
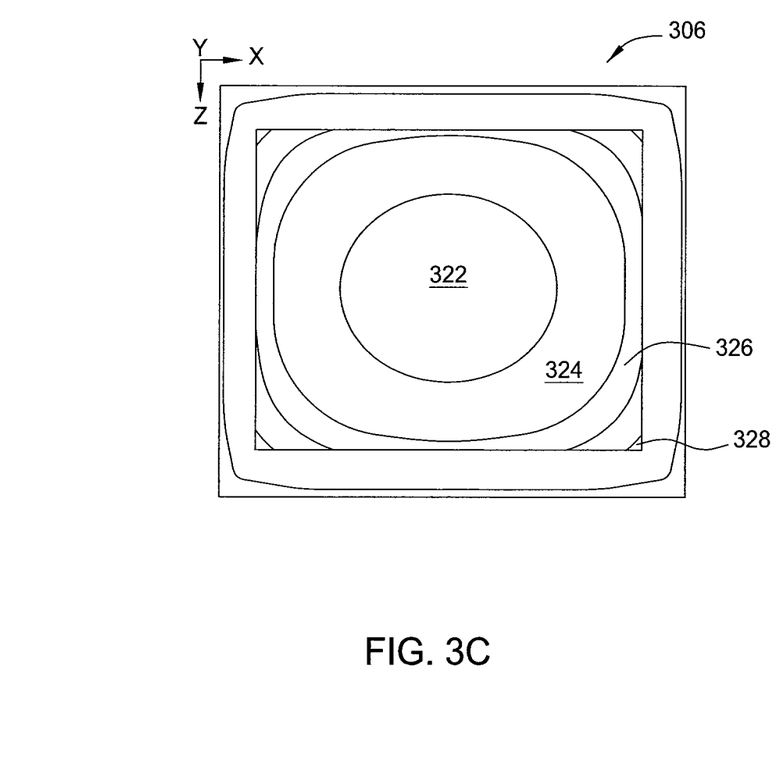
Figure 4A:
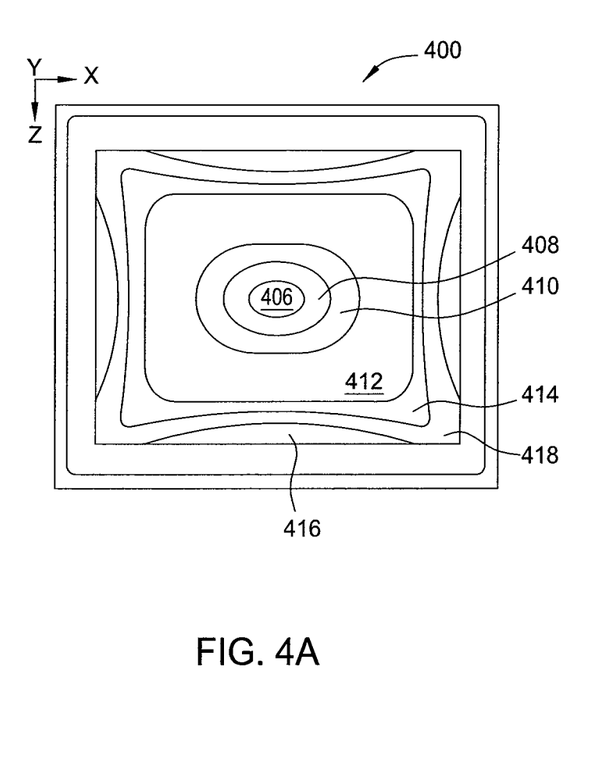
FIGS. 4A-4C depict gas flow velocity maps utilizing different examples of the substrate support assemblies of FIGS. 2A-2C.
Figure 4B:
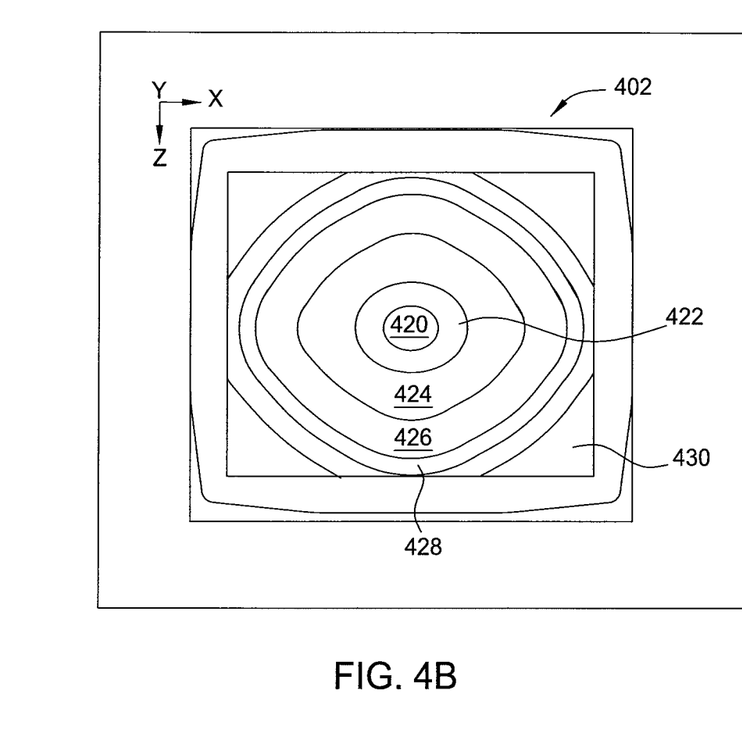
Figure 4C:
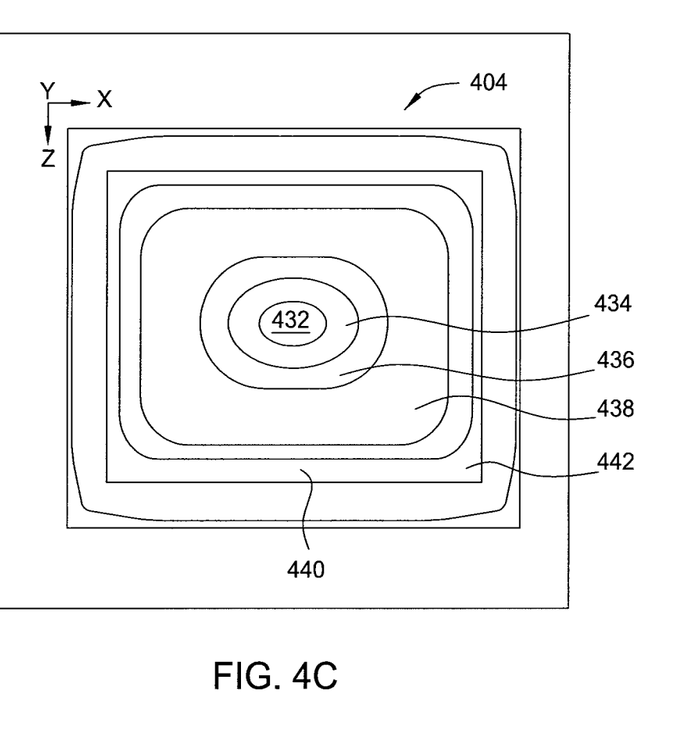

FIGS. 3A-3C depict pressure profile maps 302, 304, 306 and FIGS. 4A-4C depict gas flow velocity profile maps 400, 402, 404 detected above a substrate surface utilizing the substrate support assemblies 130, 222, 224 with different configurations from FIGS. 2A-2C respectively. As depicted in FIG. 3A with the substrate support assembly 130 having the relatively straight outer wall 252 (having a center and edge gap with the uniform width 208, 215, 207, 210 greater than 40 mm), the pressure profile as shown on the map 302 may have a relatively high pressure in the center regions 308, 309 and a relatively low pressure at the edge regions 310, 311, 312, with particularly low pressure at the corner regions 313 (e.g., center high pressure and edge low pressure). In this example, a pressure gradient (e.g., the pressure variation calculated by subtracting the lowest pressure at the corner region 313 from the highest pressure in the center region 308) may be controlled at around 0.1-0.2 Torr to maintain a center high pressure to a corner low pressure profile.

Furthermore, the gas flow velocity maps depicted in FIGS. 4A-4C, it illustrate that the variation of gas flow velocity across the substrate surface is also correlated to the different configurations of the substrate support assemblies 130, 222, 224. In the gas flow velocity map 400 depicted in FIG. 4A utilizing the substrate support assembly 130 with substantially relatively straight outer wall 252, the gas flow velocity is relatively low in the center region 406 while relatively high in the corner region 418 and the edge region 416. Particularly, the gas flow velocity at the edge region 416 is even higher than the gas flow velocity at the corner region 418 by about 15% to about 20%. In the example depicted in FIG. 4A, the gas flow velocity has a gradient profile, from a low velocity in the center, gradually ramping up to a high edge velocity (e.g., with the lowest velocity in the center region 406, and gradually to higher velocity in regions 410, 412, 414, and then an even higher velocity at the corner region 418 and the highest velocity at the edge region 416).

In another example depicted in FIGS. 3B and 4B with the substrate support assembly 222 depicted in FIG. 2B, the pressure profile map 304 and the gas flow velocity profile map 402 indicate that the substrate support assembly 222 with a relatively high corner flow (e.g., with minimum gap width 264 less than 10 mm formed in the center region 256 of the substrate support assembly 222 against the sidewall 102) may have the highest pressure in the center region 315 and the lowest gas flow velocity in the corner region 320. Similarly, the pressure gradually reduces from the center regions 316, 317 to the corner regions 318, 320. The pressure gradient (e.g., the pressure variation calculated by subtracting lowest pressure at the corner region 320 from the highest pressure in the center region 315) may be around 0.1-0.2 Torr from the center high pressure to the corner low pressure.

Furthermore, as the corner flow is enhanced by the corner gap 289 formed by the substrate support assembly 222 of FIG. 2B, the pressure at the center region 315 is higher than the pressure of the center region 308 of FIG. 3A utilizing the substrate support assembly 130 of FIG. 2A without enhanced corner flow. In one example, the pressure in the center region 315 of FIG. 3B may be around 1.46-1.48 Torr, while the pressure in the center region 308 of FIG. 3A may be around 1.41-1.42 Torr, which is about 3% to 5% higher pressure than the process without enhanced corner flow.

In contrast, the lowest gas flow velocity is found in the center region 420 and then gradually increased from the center regions 422, 424, 426 to the edge regions 428 and with the highest gas flow velocity at the corner regions 430, as shown in FIG. 4B. As discussed above, as the substrate support assembly 222 with the corner gap 289 has enhanced corner gas flow, the highest gas flow velocity at the corner regions 430, while the lowest gas flow velocity is in the center region 420. In comparing with the gas flow velocity map 402 of FIG. 4B with the map 400 in FIG. 4A (e.g., utilizing the substrate support assembly 130 without enhanced corner flow), the gas flow velocity at the corner region 430 with the enhanced corner flow from the substrate support assembly 222 may have a velocity around 8-9 m/s (meters per second), while the gas flow velocity in the corner region 418 without enhanced corner flow may be around 6-6.5 m/s, which is about 20% lower gas flow velocity. Thus, by utilizing the substrate support assembly 222, the pressure profile and the gas flow velocity profile across the substrate surface may be adjusted to efficiently improve deposition uniformity and profile control during a deposition process, and/or to enhance cleaning efficiency during a chamber cleaning process.

Furthermore, in contrast to the maps 302, 304, 400, 402 without or with the enhanced corner gas flow, the substrate support assembly 244 of FIG. 2C provides an intermediate pressure gradient and gas flow velocity gradient, as shown in the maps 306, 404 of FIGS. 3C and 4C. As the substrate support assembly 244 of FIG. 2C also provides the center gap 287 with reduced width 205 of less than 10 mm (as compared to the width 208 of greater than 40 mm defined by the gap 225 from the substrate support assembly 130), the choked gas flow may not only flow through the corner gap 280, but also through the center gap 287. Thus, the degree of the flow being preferentially directed through the corner region 219 by the substrate support assembly 130 of FIG. 2A may not be as significant as the gas flow through the corner gap 289 by the substrate support assembly 222 of FIG. 2B. Thus, by adjusting the sizes/dimensions of the gap formed in the center region between the substrate support assembly and the sidewall of the processing chamber, the amount of gas flow preferentially directed to the corners relative to the middle edge of the substrate may be adjusted, so as to obtain different deposition profiles and cleaning efficiency as needed.

The pressure profile map 306 of FIG. 3C illustrates that the substrate support assembly 224 with the center gap 287 that still allows a small amount of gas flow passing therethrough (e.g., with reduced center gap width 205 between 10 mm and 40 mm as compared to the width 208 of greater than 40 mm of FIG. 2A), the highest pressure is found in the center region 322 and the lowest pressure in the corner region 328. The pressure gradually reduces from the center regions 322, 324, 326 to the corner region 328. The pressure gradient (e.g., the pressure variation calculated by subtracting the lowest pressure at the corner region 328 from the highest pressure in the center region 322) may be around 0.1-0.2 Torr from the high pressure center to the edge/corner low pressure corner.

The pressure profile map 306 of FIG. 3C is relatively similar to the pressure profile map 302 of FIG. 3A. The pressure in the region 322 is about 1.42 Torr, which is similar to the pressure in the center region 308 of FIG. 3A.

In contrast, according to the gas flow velocity map 404 of FIG. 4C, the lowest gas flow velocity is found in the center region 432, and gradually increases from the center regions 434, 436, 438, 440 to the highest gas flow velocity similarly both at the center region 440 and at corner region 442, as shown in FIG. 4C. As the corner gas flow caused by the substrate support assembly 224 of FIG. 2C is not great as much as the corner gas flow caused by the substrate support assembly 222 of FIG. 2B, the gas flow velocity generated at the corner region 442 and the center region 440 tends to be similar, for example with a tight range of around 6-6.5 m/s, thus providing a more uniform gas flow velocity around the periphery region 107 of the substrate 140. Thus, in the embodiment where a uniform gas flow velocity is desired at both the center region and the edge region of the substrate, the substrate support assembly 224 of FIG. 2C with the reduced gap width 205 of between 10 mm and about 40 mm may be desirable.

In an example where a silicon nitride is deposited on the substrate, the substrate support assembly 222 of FIG. 2B may be utilized to enhance gas flow preferentially to the corner relative to the edges of the substrate, which enhances the silicon nitride deposition at the corners of the substrate. In another example where a silicon oxide or polysilicon (e.g., low temperature polysilicon (LTPS)) deposition process is performed, the substrate support assembly 224 of FIG. 2C may be utilized to provide a more uniform gas flow velocity at both the edge and corner regions of the substrate.

Figure 5:
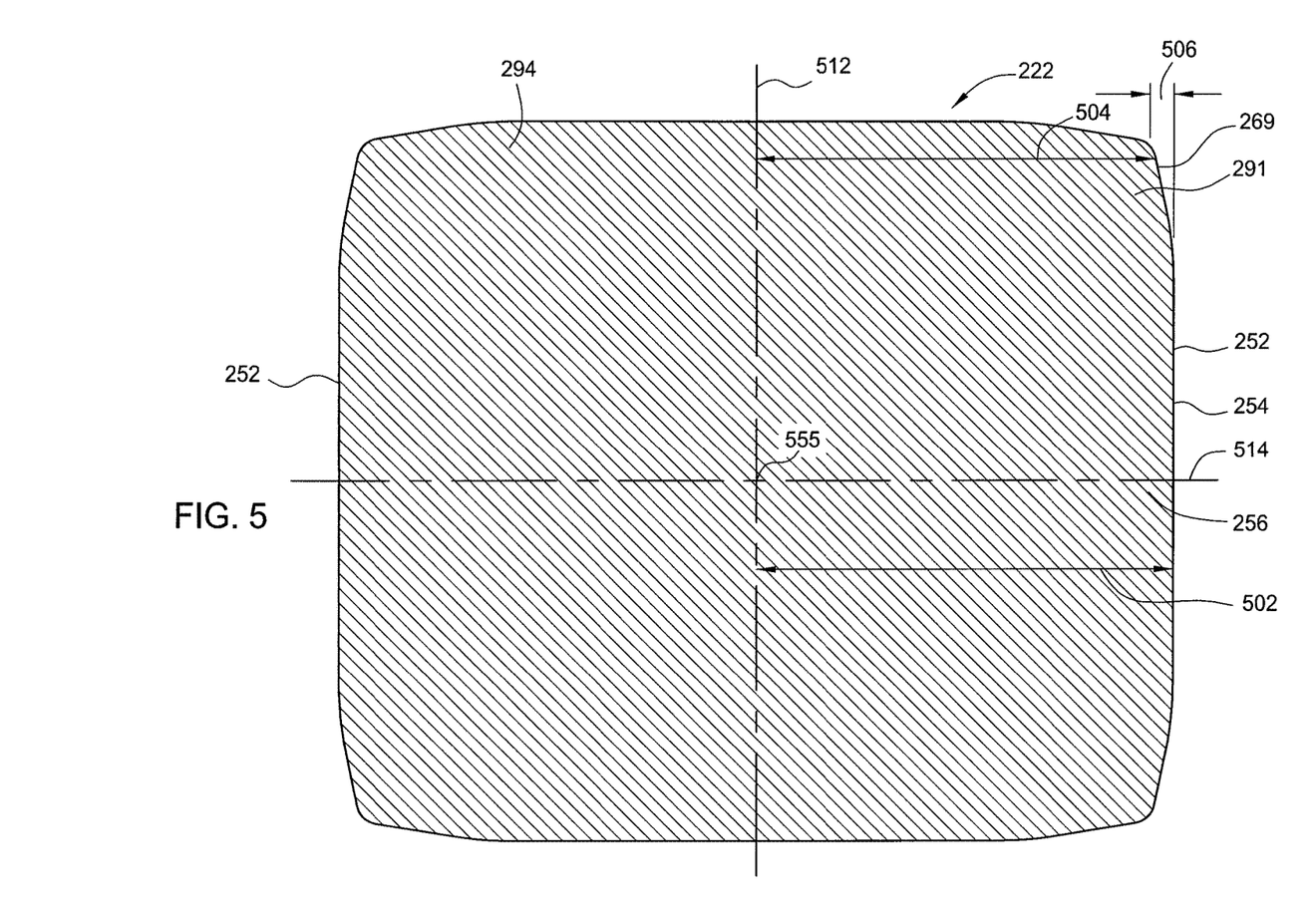
FIG. 5 depicts a top view of the substrate support assembly of FIG. 2B or 2C.

FIG. 5 depicts a top view of the substrate support assembly 222 of FIG. 2B. As discussed above, the substrate support assembly 222 has the outer wall 252 defining the substrate support body 294. The corner region 291 of the substrate support assembly 222 has the second surface 269 with the second curvature. The center region 256 has the first surface 254 that can have linear or non-linear profile as needed. In the embodiment depicted in FIG. 5, the first surface 254 in the center region 256 is substantially in linear configuration. In some examples, the first surface 254 may be curved with the first curvature. In such circumstances, the first curvature defined by a radius of the first surface 254 is less than a radius if the second curvature defined by the second surface 269. In one example, the second curvature is between about 30% to about 90% greater than the first curvature.

The substrate support body 294 has a center width 502 from a center axis 512 (when viewing in a horizontal direction) passing through a center 555 of the substrate support assembly 222 to the outer wall 252 in the center region 256 while having a corner width 504 from the center axis 512 to the outer wall 252 in the corner region 291. Similarly, the substrate support assembly 222 may also be similarly constructed with a center axis 514 passing through the center 555 when viewing vertically. In one example, the corner width 504 is between about 30% and about 90% shorter than the center width 502 of the substrate support body 294. Furthermore, a total width deviation 506 (i.e., the differences between the widths 502, 504) for one side of the substrate support body 294 from the center region 256 to the corner region 291 is between about 5 mm and about 60 mm along one side of the substrate support assembly 222. In one embodiment, the substrate support assembly 222 is rectangular.

Similarly constructed, the substrate support assembly 224 of FIG. 2C has the relatively linear surface 279 formed in the center region 283 with less curvature than the curved surface 282 formed in the corner region 281. However, as the substrate support assembly 224 of FIG. 2C is configured to still maintain the gap 287 (of between about 10 mm and about 40 mm) between the sidewall 102 and the substrate support assembly 224 when positioned in the processing chamber 100, the variation in width of the substrate support body 294 between the corner region 281 and the center region 283 may not be as large as that of the substrate support assembly 222 of FIG. 2B. For example, a total width deviation 213 alone one side of the substrate support assembly 224 of FIG. 2C from the center region 283 to the corner region 281 is between about 5 mm and about 40 mm. The center region 283 of the substrate support assembly 224 of FIG. 2C may have a width about 35% and about 85% greater than a width in the corner region 281.

Figure 6A:
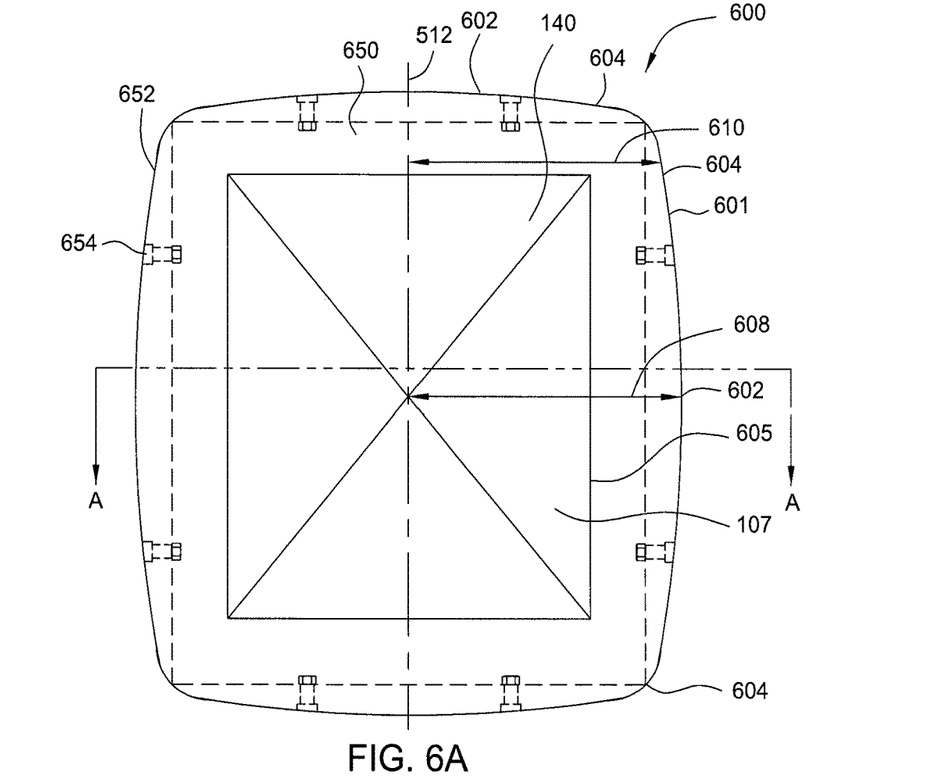
FIGS. 6A-6B depict another example of a substrate support assembly disposed in a processing chamber.
Figure 6B:
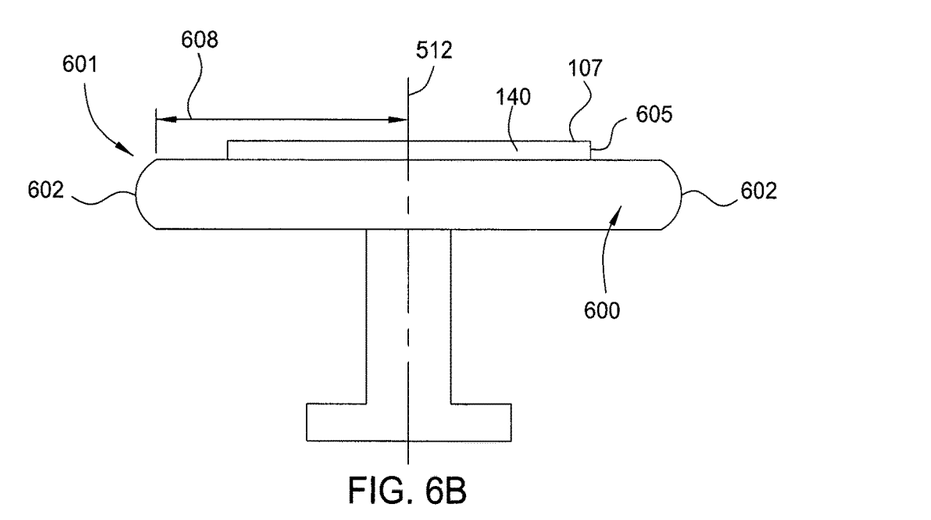

Similar to the concept above, the enhanced corner flow may also be achieved by utilizing different outer perimeter geometries formed in a substrate support, such as the substrate support assembly 600 depicted in FIGS. 6A-6B, or even in the sidewall 102 of the processing chamber 100. The substrate support assembly 600, similar to the substrate support assembly 130 described above but with different outer perimeter geometry, may have a substantially quadrilateral configuration having four sides 601 with a desire curvature formed in the substrate support assembly 600. By selecting an appropriate curvature of the sides 601, the gap between the perimeter of the substrate support assembly 600 and the sidewall 102 of the processing chamber may be varied so that more flow occurs at a corner region 604 relative to the center region 602, or at the center region 602 relative to the corner region 604, depending on the selected curvature. In the example depicted in FIG. 6A-6B, the substrate 140 is disposed on the substrate support assembly 600. Each side 601 has a center region 602 and a corner region 604. The corner region 604 has a width 610 (e.g., from the center axis 512 of the substrate support assembly 600 to the side 601 of the substrate support assembly 600) shorter than a width 608 of the center region 602. Thus, the side 601 is closer to a sidewall 605 of the substrate 140 at the corner region 604 relative to the center region 602. The enhanced corner flow may be obtained by controlling the width 610 of the corner region 604 about 30% and about 90% less than the width 608 in the center region 602.

In another example, the substrate support assembly 600 may have a rectangular-shaped substrate support body 650, similar to that of the substrate support assembly 130 depicted in FIG. 1 that has a rectangular geometry, with a removable skirt 652 attached to the substrate support body 650. The outer profile of the removable skirt 652 once attached to the substrate support body 650 creates a non-rectangular profile of the sides 601 of the substrate support assembly 600 that preferentially causes more gas to flow around certain regions of the substrate support assembly 600 relative other regions. The removable skirt 652 may be attached to the substrate support body 650 by suitable fasteners 654. The removable skirt 652 may be configured to have different geometries, e.g., including asymmetric geometries, curvatures, apertures and the like, so as to preferentially control have much gas flows pass different periphery regions 107 of the substrate 140. As the pumping port 105 may be located to a certain side of processing chamber 100, as shown in FIG. 1, the conductance of gas flow around the sides 601 of the substrate support assembly 600 may be non-uniform, resulting in an asymmetric gas flow velocity or gas flow profile along different sides of the periphery region 107 of the substrate 140. By utilizing the removable skirt 652, the outer perimeter profile of the sides 601 of the substrate support assembly 600 may be changed so as to control the gas flow path or gas flow adjacent to the periphery region 107 of the substrate 140. For example, the shape of the skirt 652 may be selected to have a smaller gap with walls of the processing chamber 100 proximate the pumping port 105 relative to the opposite side of the substrate support assembly 600 so that the flow of gases around the periphery region 107 of the substrate support 601 and substrate 140 is substantially uniform. Furthermore, the removable skirt 652 may be optionally implemented only certain sides 601 (e.g., not all four sides 601 of the substrate support assembly 600) so as to obtain an asymmetric gas flow if desired, or to correct gas flow asymmetry costed by other asymmetries within the processing chamber.

FIG. 6B depicts a cross sectional view of the substrate support assembly 600 taken along section line A-A. The center region 602 has a curved geometry resulting in a predetermined width 608 as measured from the sidewall 605 of the substrate 140. As discussed above, the width 610 defined in the corner region 604 is less than the width 608 shown in FIG. 6B. It is noted that the enhanced corner flow can also be obtained by altering the geometry of the sidewall 102 of the processing chamber 100 to make the sidewall 102 of the processing chamber 100 curved in a manner that can generate different gas flow velocity/pressure to the substrate 140 as needed.

In summary, embodiments disclosed herein relate to substrate support assemblies with different outer perimeter geometries that may be utilized to alter or adjust gas flow path (i.e., the ratio of the gas delivered to the corner of the substrate relate to the substrate edge) velocity and process pressure provided across the substrate surface. By doing so, a uniform or non-uniform gas flow path may be selected for different process requirements or circumstances to obtain a desired gas distribution across the substrate surface so as to improve deposition or cleaning efficiency.

While the foregoing is directed to embodiments of the invention, other and further embodiments of the invention may be devised without departing from the basic scope thereof.

What is claimed is:

1. A substrate support assembly, comprising:
a substrate receiving surface and a bottom surface; and
sides circumscribing the substrate receiving surface vertically connected between the substrate receiving surface and the bottom surface, the sides defining a perimeter of the substrate support assembly; wherein a corner region and a center region defined on the sides are formed as part of the sides, wherein the corner region has a corner width that is smaller than a center width of the center region, the widths defined between a horizontal center axis and one of the sides of the substrate support assembly, the horizontal center axis passing through a midpoint of one of the sides and parallel to the substrate receiving surface.

2. The substrate support assembly of claim 1, wherein a difference between the center width to the corner width is between about 5 mm and about 60 mm.

3. The substrate support assembly of claim 1, wherein the center width is between about 30% and about 90% larger than the corner width.

4. The substrate support assembly of claim 1 further comprising:
a rectangular substrate support body having four sides; and
a removable skirt attached to one of the sides of the rectangular substrate support body, wherein the removable skirt defines a boundary the corner region and the center region.

5. The substrate support assembly of claim 1, wherein the perimeter has a geometry that preferentially directs flow to one region of the substrate support assembly relative to another region.

6. The substrate support assembly of claim 1, wherein a portion of the perimeter in the corner region has a curvature and a portion of the perimeter in the center region is substantially linear.

7. The substrate support assembly of claim 1, wherein the center axis passes through a center of the substrate support assembly.

8. A substrate support assembly, comprising:
a substrate receiving surface and a bottom surface; and
sides circumscribing the substrate receiving surface vertically connected between the substrate receiving surface and the bottom surface, the sides defining a perimeter of the substrate support assembly; wherein a corner region and a center region defined on the sides are formed as part of the sides, wherein the corner region and the center region formed in the substrate support assembly form an unitary substrate support body defining the substrate receiving surface, the bottom surface and the sides in the substrate support assembly, wherein the corner region has a corner width that is smaller than a center width of the center region, the widths defined between a horizontal center axis of the substrate support and one of the sides of the substrate support body.

* * * * *

UNITED STATES PATENT AND TRADEMARK OFFICE
CERTIFICATE OF CORRECTION

PATENT NO. : 10,280,510 B2
APPLICATION NO. : 15/082015
DATED : May 7, 2019
INVENTOR(S) : Shinichi Kurita et al.

Page 1 of 1

It is certified that error appears in the above-identified patent and that said Letters Patent is hereby corrected as shown below:

In the Specification

In Column 10, Line 60, delete "FIG." and insert -- FIGS. --, therefor.

In the Claims

In Column 12, Line 34, in Claim 4, after "boundary" insert -- at --.

Signed and Sealed this
Second Day of July, 2019

Andrei Iancu
*Director of the United States Patent and Trademark Office*